United States Patent [19]

Krause et al.

[11] Patent Number: 5,441,614

[45] Date of Patent: Aug. 15, 1995

[54] METHOD AND APPARATUS FOR PLANAR MAGNETRON SPUTTERING

[75] Inventors: Dennis L. Krause, Atkinson; David C. Wojewoda, Londonderry, both of N.H.

[73] Assignee: AT&T Corp., Murray Hill, N.J.

[21] Appl. No.: 346,810

[22] Filed: Nov. 30, 1994

[51] Int. Cl.⁶ ............................................. C23C 14/34
[52] U.S. Cl. ........................... 204/192.12; 204/298.09; 204/298.19
[58] Field of Search ............... 204/192.12, 298.09, 204/298.12, 298.16, 298.17, 298.19

[56] References Cited

U.S. PATENT DOCUMENTS

| | | | |
|---|---|---|---|
| 3,878,085 | 4/1975 | Corbani | 204/298 |
| 4,407,708 | 10/1983 | Landau | 204/298.19 X |
| 4,434,042 | 2/1984 | Keith | 204/298 |
| 4,486,289 | 12/1984 | Parsons et al. | 204/298 |
| 4,606,802 | 8/1986 | Kobayashi et al. | 204/192 R |
| 4,734,183 | 3/1988 | Wirz et al. | 204/192.12 X |
| 5,026,471 | 6/1991 | Latz et al. | 204/192.19 |
| 5,262,028 | 11/1993 | Manley | 204/192.12 |
| 5,266,178 | 11/1993 | Sichmann | 204/192.12 X |
| 5,277,779 | 1/1994 | Henshaw | 204/298.24 |
| 5,282,947 | 2/1994 | Brugge et al. | 204/298.2 |
| 5,286,361 | 2/1994 | Makowiecki et al. | 207/298.19 X |
| 5,317,006 | 5/1994 | Kumar | 204/298.12 |

Primary Examiner—Nam Nguyen

[57] ABSTRACT

A magnetron sputtering apparatus is disclosed having a cooling block including an inner conduit. A target is provided having first and second grooves in a first surface thereof. At least a portion of the first surface of the target is in contact with a first surface of the cooling block. A first pole piece is positioned within the first groove, and a second pole piece is positioned within the second groove. A first magnet is provided having a first polarity in contact with the first pole piece. A second magnet is provided having the opposite polarity of the first magnet in contact with the second pole piece. A plate is provided in contact with a second surface of the cooling block and the first and second magnets. Means are provided for supplying a coolant to the inner conduit of the cooling block and for applying a voltage to the cooling block. The first and second pole pieces conduct a magnetic flux produced by the first and second magnets towards an opposite second surface of the target.

20 Claims, 4 Drawing Sheets

METHOD AND APPARATUS FOR PLANAR MAGNETRON SPUTTERING

BACKGROUND OF THE INVENTION

1. Field of the Invention

This invention relates to methods and apparatus for sputtering material on a substrate, and more particularly to planar magnetron sputtering methods and apparatus.

2. Description of the Related Art

A sputtering process to deposit thin films of various conductive or insulating material on the surfaces of objects or substrates is well-known. The target material to be sputtered and deposited on the substrate is subjected to bombardment by ions which dislodge and eject material from the target onto a substrate. The target and substrate are generally placed in a evacuable chamber containing a heavy inert gas, such as argon, maintained at a relatively low pressure. Ions are created and accelerated to high velocities in directions substantially perpendicular to the front surface of the target.

Glow discharge sputtering produces a high density of ionized bombarding particles by mounting the target on a cathode biased at a strong negative potential. The cathode and target, together with the apparatus maintained at ground potential, create an electric field substantially perpendicular to the exposed front surface of the target, and accelerate positive ions to bombard the target material which eject target atoms that subsequently condense to form a thin film on the surface of the substrate.

Sputtering efficiency may be improved by maximizing the number of ions bombarding the target surface. Planar magnetron sputtering devices utilize magnets in proximity to the target to produce a magnetic field which traps and directs electrons near the target, thereby increasing the rate of ion generation and resulting ion density near the target The electric field $\bar{E}$, created by the cathode and ground configuration, is substantially perpendicular to the target surface, whereas the flux lines of the magnetic field $\bar{B}$ tend to exit from and return to the target surface, forming a closed arch. In the locations where the electric field $\bar{E}$ and magnetic field $\bar{B}$ are perpendicular to each other, free electrons acquire a velocity parallel to the target surface, expressed as the vector cross product of the electric field $\bar{E}$ and magnetic field $\bar{B}$ (i.e. the $\bar{E} \times \bar{B}$ velocity).

The magnet elements may be configured to restrain electron movement to a closed ring-shaped pathway parallel to the target surface. The erosion pattern of the target, resulting from displacement of the target material by the ionized gas, corresponds to the electron path and takes the form of an annular depression. Target replacement generally must occur when the annular erosion has progressed deeply into the target surface.

The current planar magnetron sputtering process is associated with several drawbacks. First, the existing devices are inefficient when operated at lower vacuum pressures, i.e. less than one millitorr. Tests conducted tinder low pressure have resulted in unstable sputtering plasma, and normally require higher voltage to operate properly. Second, excessive heating of the target results from continual bombardment by high energy ions as well as exposure to high power necessary to establish a negative potential. Therefore, effective cooling of the target material is essential. Finally, current magnetic configurations apply thin films unevenly and tend to erode the target surface inefficiently. Replacement is often required when only 20% to 30% of the target material has been utilized.

Several types of magnetron devices have been proposed to overcome some of the deficiencies associated with the existing art. For example, U.S. Pat. No. 5,262,028 to Manley discloses an apparatus having a plurality of magnets, including a center booster magnet, and a thicker target in which a center section has been cut away. This arrangement is intended to shape the magnetic field to create a wider and more uniform erosion pattern. However, distortion of the magnetic field through magnets of differing field strengths and polarities may increase target erosion efficiency at the expense of uneven thin film deposition. Furthermore, the magnetic flux lines may be dependent on target placement and be subject to change as the target is eroded. The use of a plurality of magnets to create the magnetic nodes necessary to bring the magnetic flux lines parallel to the target material may complicate the design and manufacture of the magnetron. Finally, the complicated magnet assembly is interposed between the target and cooling system, thereby interfering with temperature regulation of the target material.

Therefore, there is a need for a planar magnetron sputtering device which provides improved film quality and deposition uniformity, operates at low pressure and low voltages, facilitates effective target cooling, and is simple to fabricate.

SUMMARY OF THE INVENTION

A magnetron sputtering apparatus is disclosed having a cooling block including an inner conduit. A target is provided having first and second grooves in a first surface thereof. At least a portion of the first surface of the target is in contact with a first surface of the cooling block. A first pole piece is positioned within the first groove, and a second pole piece is positioned within the second groove. A first magnet is provided having a first polarity in contact with the first pole piece. A second magnet is provided having the opposite polarity of the first magnet in contact with the second pole piece. A plate is positioned in contact with a second surface of the cooling block and the first and second magnets. Means are provided for supplying a coolant to the inner channel of the cooling block and for applying a voltage to the cooling block. The first and second pole pieces conduct a magnetic flux produced by the first and second magnets towards an opposite second surface of the target.

A method is disclosed for sputtering material onto a substrate in a sputtering chamber. The method includes the steps of disposing a target of the sputtering material in the sputtering chamber such that first and second pole pieces are positioned within first and second grooves in a first surface of the target. The first surface of the target faces a first surface of a cooling block and first and second magnets. The first surface of the target is brought into firm abutment with the cooling block such that the first and second magnets are in contact with the first and second pole pieces. A plate is brought in contact with a second surface of the cooling block and with the first and second magnets. The magnetic flux produced by the first and second magnets is conducted to a second opposite surface of the target by the first and second pole pieces. The substrate is disposed in the sputtering chamber in opposed relationship to the second surface of the target to define a sputtering area within the sputtering chamber between the substrate and the second surface of the target. The material is sputtered from the second surface of the target across the sputtering area in the sputtering chamber such that the sputtering material is deposited on the substrate.

BRIEF DESCRIPTION OF THE DRAWINGS

So that one skilled in the art to which the subject invention appertains will better understand how to practice the method of the present invention, preferred embodiments of the method will be described in detail hereinbelow with reference to the drawings wherein.

DETAILED DESCRIPTION OF THE PREFERRED EMBODIMENTS

Figure 1:
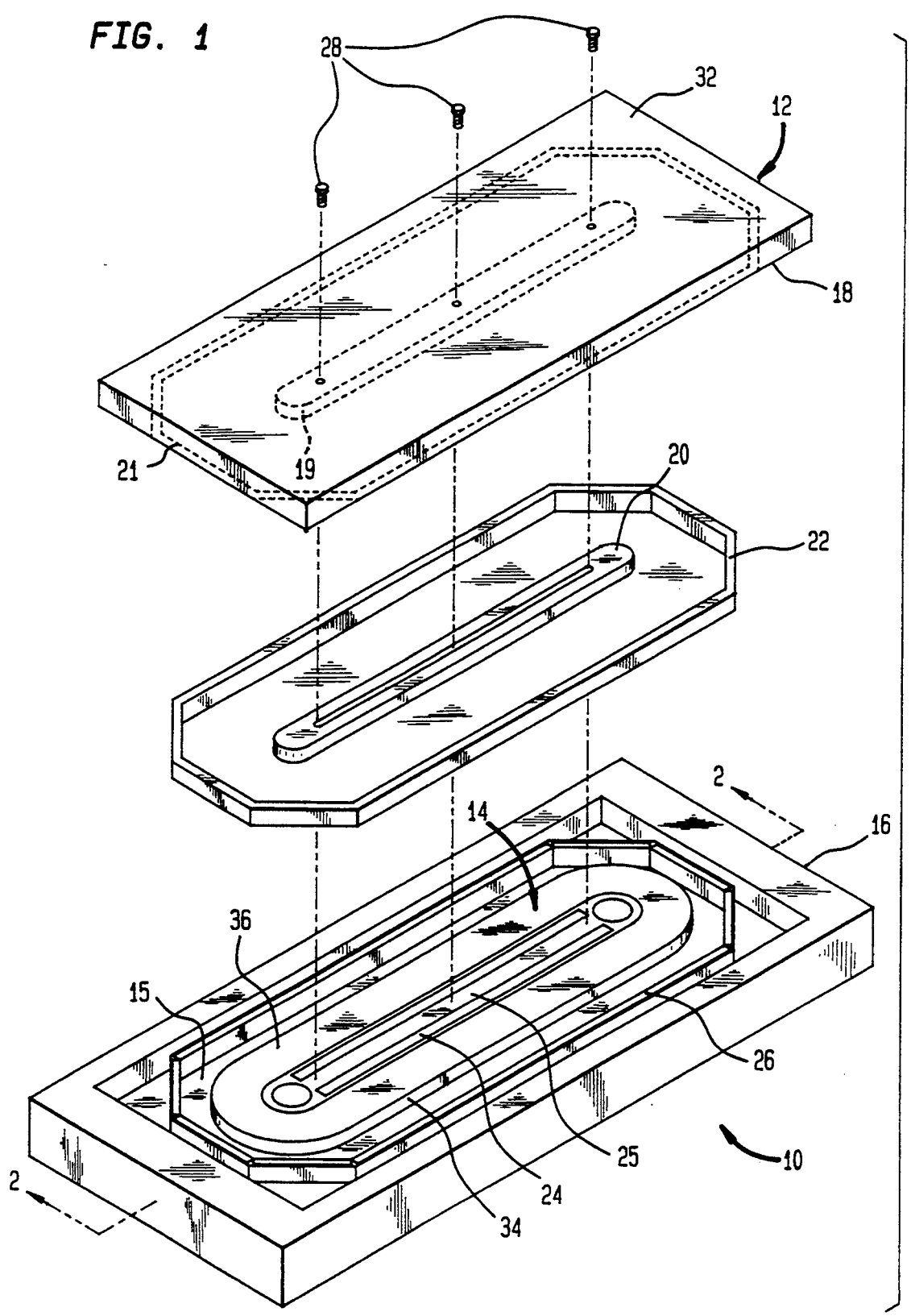
FIG. 1 is an exploded perspective view of a preferred embodiment of the present apparatus.

A preferred planar magnetron sputtering device is illustrated in FIG. 1, and is designated generally by reference numeral 10. The apparatus 10 includes a target 12 which may be composed of copper or some other metallic and non-magnetic material such as titanium or a titanium palladium alloy to prevent corrosive interaction between copper and titanium. It is possible to sputter other materials as well, such as ternary metals. The target 12 rests on a cooling block 14, which is in contact with a magnetic backing plate 15. The target 12, cooling block 14, and backing plate 15 are housed within a door assembly 16. A first surface 18 of the target 12 is provided with a first groove 19 and a second groove 21 (indicated in phantom). A first inner pole piece 20 and a second outer pole piece 22 fit within the grooves provided in a first surface 18 of the target 12. The inner pole piece 20 and outer pole piece 22 contact a rim of a first, inner magnet 24 and that of a second, outer magnet 26, respectively. The target 12 is brought into firm abutment with the cooling block 14 and retained thereon by means of screws 28 passing through the target 12. In a preferred embodiment, the door assembly 16 with the target 12 and magnets 24 and 26 is placed into an evacuable sputtering chamber (not shown) in opposed relationship to a substrate 100 mounted therein. A sputtering area defined within the sputtering chamber between the substrate and an opposite second surface 32 of the target 12.

Figure 2:
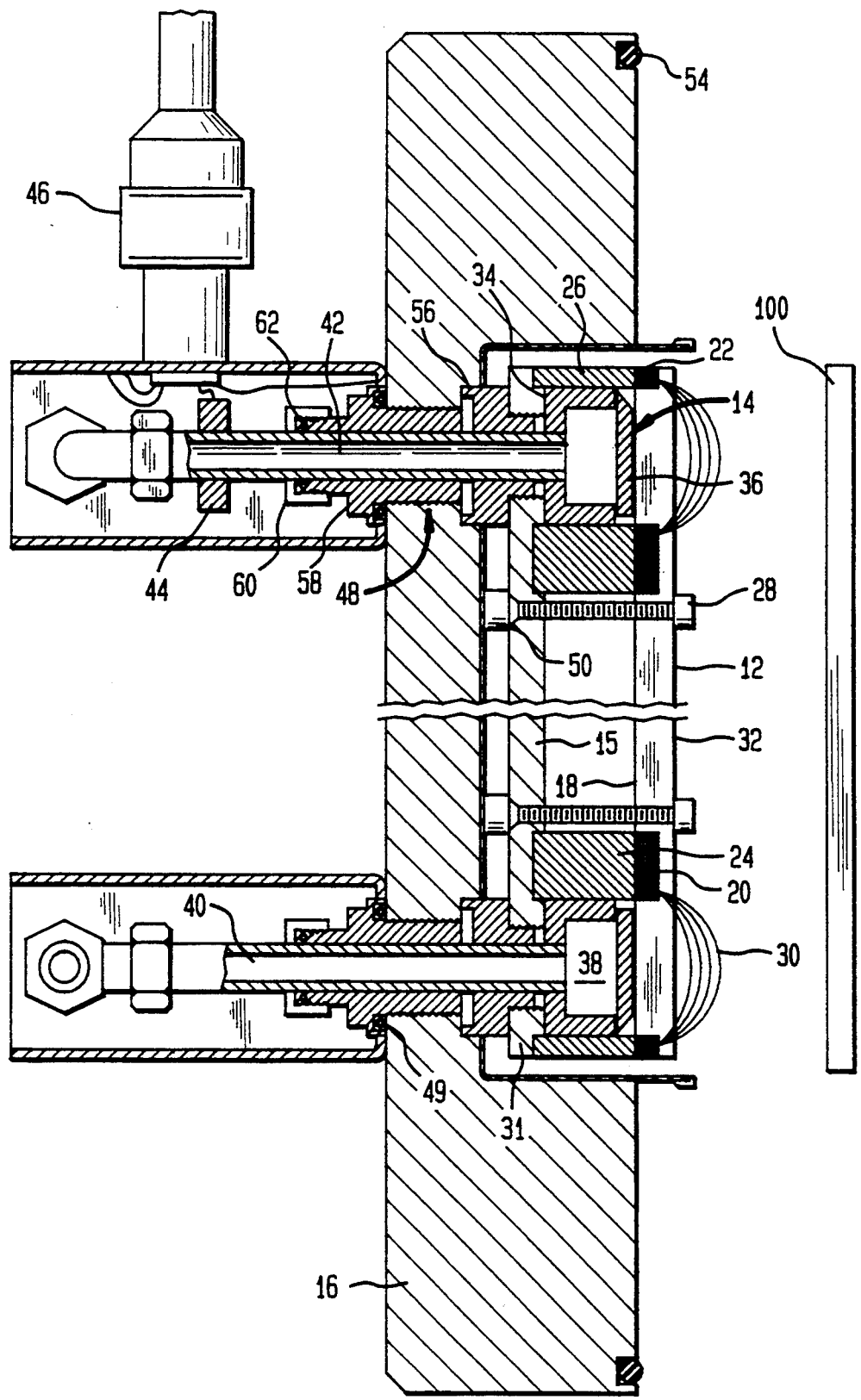
FIG. 2 is a cross-sectional view of the present apparatus through line 2—2 of FIG. 1.

With continued reference to FIG. 1, the sputtering apparatus 10 includes permanent inner magnet 24 and outer magnet 26, which are preferably ceramic magnets, such as barium nitrite. The inner magnet 24 may be a straight bar magnet, or as shown in the preferred embodiment, the magnet 24 may be fabricated as a pair, separated by non-magnetic spacer 25, composed preferably of aluminum, to facilitate central mounting of the target 12. The outer magnet 26 is constructed in a box-like configuration to surround the inner magnet 24. In the preferred embodiment, it is composed of a plurality of straight magnets in an octagonal shape in order for the magnet sections to remain substantially equidistant from the inner magnet 24. The inner magnet 24 is located in a central opening in the cooling block 14, and the outer magnet 26 surrounds the block 14. The top surface of the block 14 is substantially coplanar with the top rims of the inner magnet 24 and outer magnet 26. The permanent magnets 24 and 26 are oppositely magnetically oriented such that the pole of the inner magnet 24 in contact with the inner pole piece 20 is of the opposite polarity of the pole of the outer magnet 26 in contact with the outer pole piece 22. As can be seen in FIG. 2, magnetic lines of force are provided which emerge from one of the magnets, pass through the target 12 and subsequently return through the target 12 to the other magnet, forming an arch 30. The magnetic backing plate 15 is in contact with the magnets 24 and 26, and completes the magnetic circuit path 31. The backing plate may be composed of a non-magnetic, magnetizable material such as soft iron, and it may be plated with nickel to prevent corrosion. The substantially concentric configuration of the inner magnet 24 and outer magnet 26 forms a continuous series of arched magnetic lines of force which extend in the form of a closed tunnel-like path between the inner magnet 24 and outer magnet 26.

Inner pole piece 20 and outer pole piece 22 are provided in order to move the magnetic flux closer to the upper surface 32 of the target 12. The pole pieces 20 and 22 are composed of a non-magnetic, magnetizable material, such as soft iron or cold-rolled steel, which are effective in conducting the magnetic flux. In the preferred embodiment, the pole pieces 20 and 22 are configured with substantially the same planform shape as the permanent magnets 24 and 26 and are placed on the rim of the magnets. As indicated in phantom in FIG. 1, the first surface 18 of the target 12 is milled in the planform shape of the pole pieces 20 and 22 to a depth nominally exceeding the height of the pole pieces. This milling permits the pole pieces 20 and 22 to be embedded in the target 12. The pole pieces 20 and 22 act as extensions of the poles of the underlying magnets 24 and 26, respectively, and therefore have opposite polarity from each other. As a result of moving the pole pieces closer to the second surface 32 of the target 12, the magnetic flux lines are brought approximately parallel to the surface 32, and the magnetic field strength increases substantially to nearly maximum strength. This increase in magnetic field strength permits the sputtering apparatus 10 to be operated at lower voltages and lower pressures. Uniformity of deposited film could be controlled on sputtered substrates by varying the size and shape of the pole pieces 20 and 22.

The cooling block 14 both provides temperature regulation of the target 12 as well as serving as conductor means for connecting the target 12 to a source of negative electrical potential. Milling the first surface 18 of the target 12 to a depth that exceeds the height of the pole pieces 20 and 22 to create an allowance therebetween permits the target 12 to be in a tight compressive fit with the cooling block 14 in order to provide an effective interface for target cooling and for electrical conductivity.

In the preferred embodiment, the cooling block 14 has a lower channel section 34 having a substantially U-shaped cross-section, as seen in FIG. 2, and a ring-shaped planform, as seen in FIG. 1. The cooling block 14 also includes a cover plate 36, having a ring-shaped planform and fitting over the cooling block channel section 34, thereby forming a conduit 38 in which a coolant, such as water, may circulate. In the preferred embodiment, the cross-sectional area of conduit 38 is maximized in the space between the inner magnet 24 and the outer magnet 26 in order to most effectively cool the target 12. A cooling water input tube 40, constructed of a conductive material such as stainless steel, extends from a cooling water source (not shown) into an aperture provided in the lower surface of the channel section 34. Coolant passes through the conduit 38 to cool the target 12, and is returned for recooling through a return tube 42 extending from another aperture in the channel section 34. In addition, the cooling block 14, and more particularly the channel section 34, is in contact with the backing plate 15, which assists in temperature regulation of the backing plate 15, as well as the magnets 24 and 26.

High voltage is applied to the cooling block 14 during the operation of the sputtering apparatus 10 by connecting an electrical collar 44 on a high voltage cable 46 to a portion of either the cooling input tube 40 or the return tube 42. Since the cooling block 14 and cooling tubes 40 and 42 are of a conductive material, these components conduct a negative potential to the target 12. The sputtering apparatus 10, particularly the door assembly 16 is electrically grounded with respect to the cooling block 14 and target 12. The door assembly 16 is isolated from the cooling tubes 40 and 42 by insulative sleeves 48 composed of a material such as teflon, and by insulative O-rings 49. The insulative sleeves 48 may be fabricated in separate sections to improve isolation. In a preferred embodiment, sleeves 48 may consist of a first sleeve section 56 having a threaded portion and inserted in backing plate 15, a second sleeve section 58 also provided with threads and inserted in door assembly 16, and an insulating collar 60 and an O-ring 62 surrounding the water tubes 40 and 42 and providing a vacuum seal between the sputtering chamber and the outside atmosphere. An electric field is created substantially perpendicular to the upper surface 32 of the target 12. Ceramic spacers 50 provide support for the cooling block 14, target 12, and backing plate 15. The height of the spacers 50 is optimized to prevent plasma from forming between the backing plate 15 and door assembly 16 in order to inhibit sputtering of these components which would contaminate the film being deposited onto the substrate 100.

The sputtering apparatus 10 may be operated in an evacuable chamber, together with the substrate 100 or piece part to be coated. The sputtering apparatus 10 and substrate 100 are capable of being oriented in a horizontal configuration such that substrate materials may be systematically conveyed beneath the target 12 for enhanced productivity. However, a vertical orientation offers several advantages over the horizontal orientation. By orientating the plane of the target surface 32 vertically, as shown in FIG. 2, target material ordinarily flaking off the target 12 would fall to the bottom of the chamber and not onto the substrate 100 itself. Furthermore, the vertical orientation relieves some stress on the cooling tubes 40 and 42.

Figure 3:
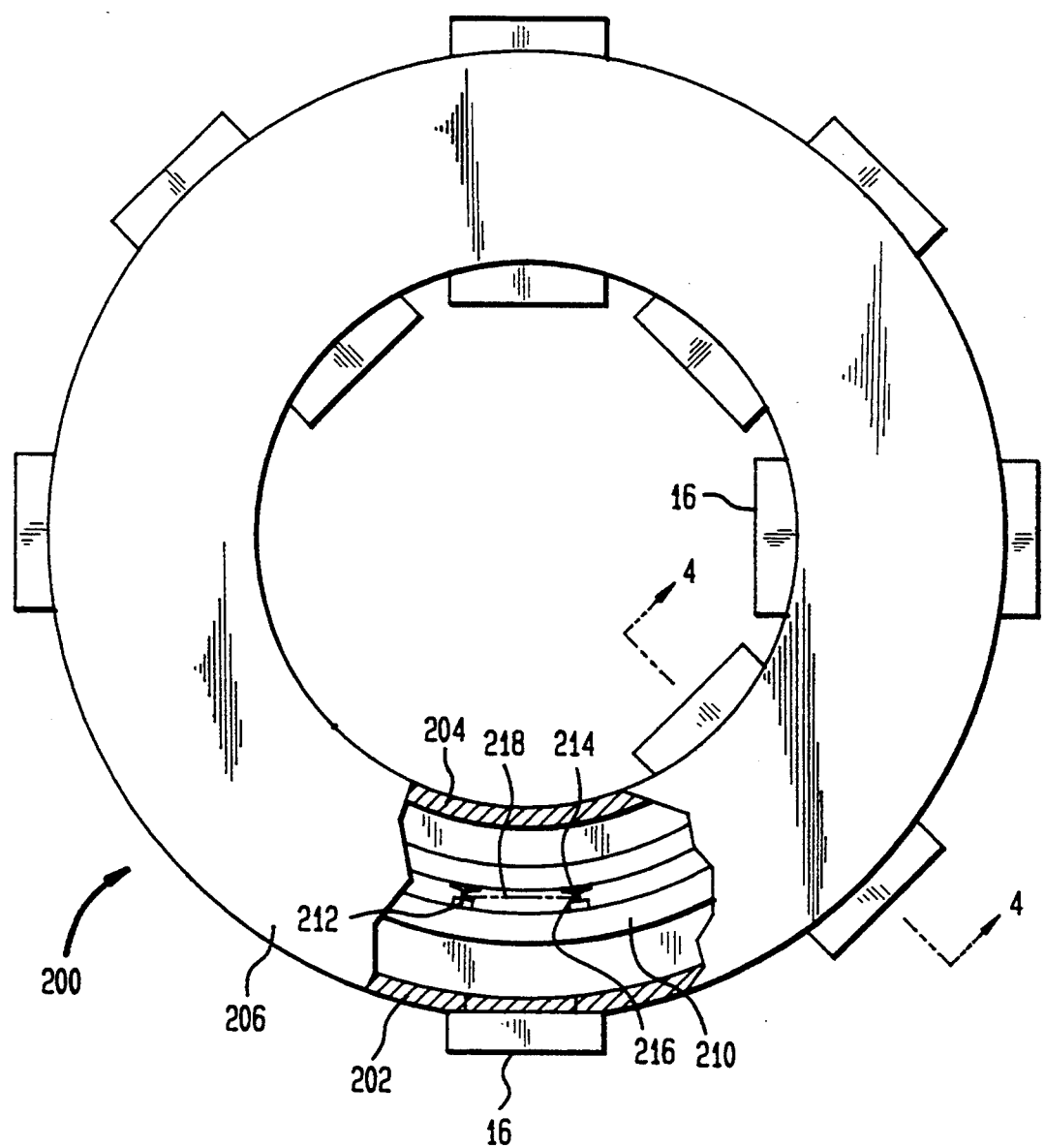
FIG. 3 is a top view in partial cross-section of a sputtering chamber in accordance with the preferred embodiment.
Figure 4:
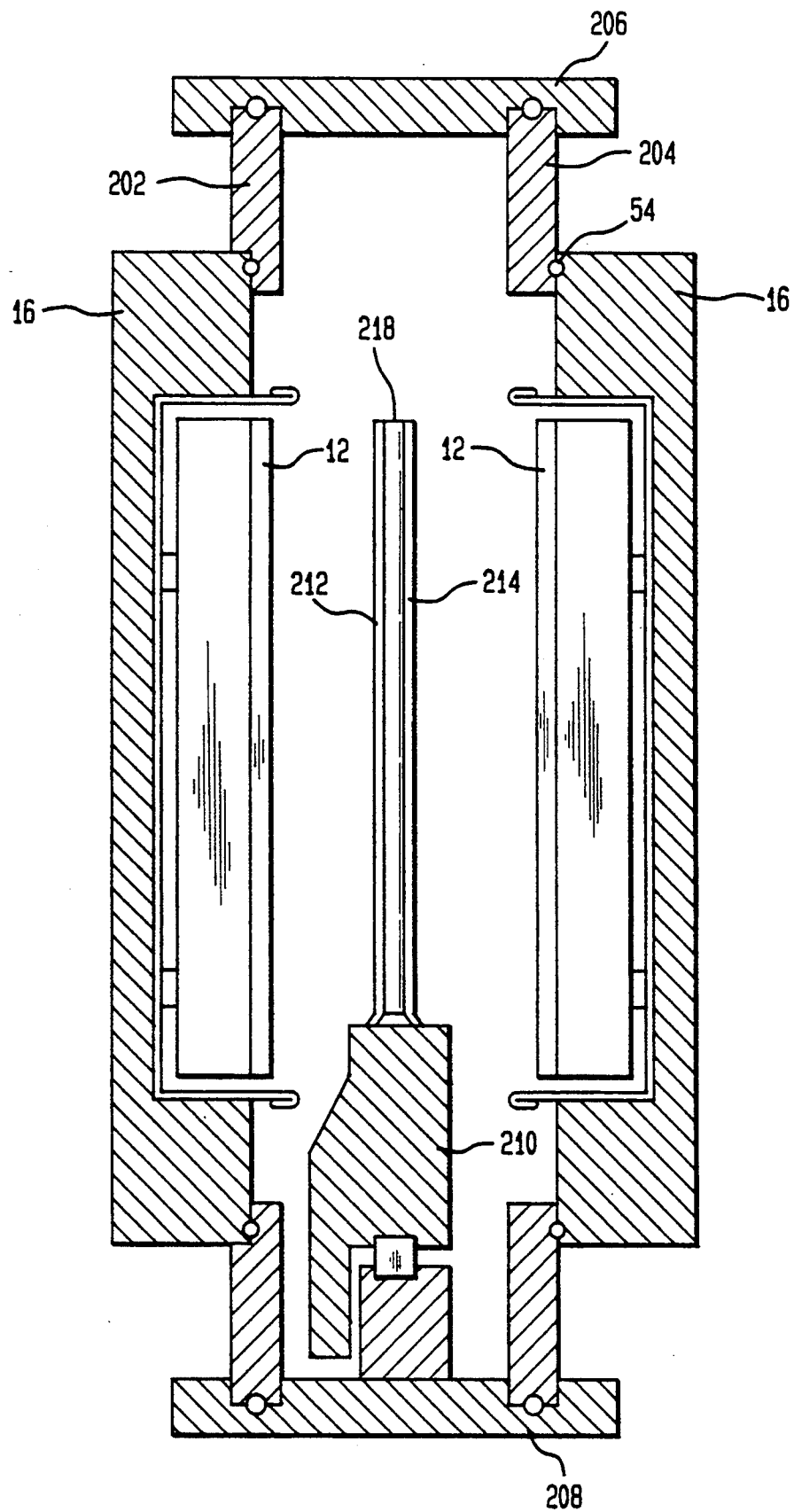
FIG. 4 is a cross-sectional view of the apparatus, taken along the line 4—4 in FIG. 3.

A typical sputtering chamber 200 is shown in FIGS. 3 and 4. Sputtering chamber 200 may be constructed, for example, in a substantially cylindrical configuration consisting of an outer cylindrical wall member 202, an inner cylindrical wall member 204, a horizontal cover plate 206, and a horizontal base plate 208. Door assemblies 16 with targets 12 mounted therein as described above are mounted within rectangular apertures in the wall members 202 and 204 with annular seals 54 to prevent loss of pressure or contamination of sputtering process. The sputtering gas mixture is introduced into the sputtering chamber through a port (not shown), and a vacuum is provided in the sputtering chamber 200 by means well known in the art.

A rotatable carousel 210 comprises a series of upstanding circumferentially spaced support posts 212 fixedly secured at lower ends thereof. Each support port 212 has a guideway assembly 214 such as inner and outer plates separated by an intermediate plate of reduced width, to define substrate holder edge-receiving guideways 216. A pair of planar substrates 100 are loaded in a rectangular frame-type holder or "tray" 218. The substrates 100 may be conveyed in a carousel fashion in front of the individual targets 12. A vacuum load lock (not shown) could be provided to remove sputtered substrates and insert new substrates while maintaining the very low pressure conditions.

Although the subject invention has been described with respect to the preferred embodiment, it will be readily apparent to those having ordinary skill in the art to which it appertains that changes and modifications may be made thereto without departing from the spirit or scope of the subject invention as defined by the appended claims.

What is claimed is:

1. A magnetron sputtering apparatus comprising:
a cooling block having an inner conduit;
a target having first and second grooves in a first surface thereof, at least a portion of the first surface of the target in contact with a first surface of the cooling block;
a first pole piece positioned within the first groove;
a second pole piece positioned within the second groove;
a first magnet having a first polarity in contact with the first pole piece;
a second magnet having the opposite polarity of the first magnet in contact with the second pole piece;
a plate in contact with a second surface of the cooling block and the first and second magnets;
means for supplying a coolant to the inner conduit of the cooling block; and
means for applying a voltage to the cooling block;
wherein the first and second pole pieces conduct a magnetic flux towards an opposite second surface of the target, the magnetic flux produced by the first and second magnets.

2. The magnetron sputtering apparatus of claim 1, wherein the second magnet has a rim substantially coplanar with a rim of the first magnet and encircles the first magnet.

3. The magnetron sputtering apparatus of claim 2, wherein the second groove in the target describes a closed loop encircling the first groove.

4. The magnetron sputtering apparatus of claim 3, wherein the second pole piece encircles the first pole piece.

5. The magnetron sputtering apparatus of claim 4, wherein the cooling block is a closed ring having a central opening.

6. The magnetron sputtering apparatus of claim 5, wherein the first magnet is positioned within the central opening of the cooling block, and the second magnet is positioned surrounding the cooling block.

7. The magnetron sputtering apparatus of claim 6, wherein the surface of the cooling block is substantially coplanar with the rims of the first and second magnets.

8. The magnetron sputtering apparatus of claim 1, wherein the grooves in the target having a depth nominally exceeding the thickness of the first and second pole pieces positioned therein.

9. The magnetron sputtering apparatus of claim 1, which further comprises abutment means adapted to bring the target into contact with the first surface of the cooling block.

10. The magnetron sputtering apparatus of claim 1, wherein the first and second pole pieces are composed of soft iron.

11. The magnetron sputtering apparatus of claim 1, wherein the target is a material selected from the group consisting of copper, titanium and titanium-palladium alloy.

12. A magnetron sputtering system for sputtering particles from a target onto a substrate, comprising:
an evacuable chamber containing means for mounting the substrate and a door assembly;
a cooling block mounted within the door assembly and electrically insulated therefrom;
a target having a first surface including first and second grooves and a second surface adjacent to the substrate, at least a portion of the first surface in contact with a first surface of the cooling block;
a first pole piece positioned within the first groove;
a second pole piece positioned within the second groove;
a first magnet having a first polarity in contact with the first pole piece;
a second magnet having the opposite polarity of the first magnet in contact with the second pole piece;
a plate in contact with a second surface of the cooling block and the first and second magnets;
means for supplying a coolant to an inner conduit in the cooling block; and
means of applying a voltage to the cooling block for producing an electric field substantially perpendicular to the target to accelerate ions into the target and thereby sputter particles from an opposite second surface of the target;
wherein the first and second pole pieces conduct a magnetic flux towards the second surface of the target, the magnetic flux produced by the first and second magnets.

13. The sputtering system of claim 12, wherein the second magnet is formed as a closed loop encircling the first magnet.

14. The sputtering system of claim 13, wherein the second groove in the target describes a loop encircling the first groove.

15. The sputtering system of claim 14, wherein the second pole piece encircles the first pole piece.

16. The sputtering system of claim 12, wherein the grooves in the target having a depth nominally exceeding the thickness of the first and second pole pieces positioned therein.

17. A method of sputtering material onto a substrate in a sputtering chamber, which comprises the steps of:
disposing a target of the sputtering material in the sputtering chamber such that first and second pole pieces are positioned within first and second grooves in a first surface of the target, the first surface of the target facing a first surface of a cooling block and first and second magnets, the first and second magnets producing a magnetic flux;
bringing the first surface of the target into abutment with the cooling block such that the first and second magnets are in contact with the first and second pole pieces, the first and second pole pieces conducting the magnetic flux to a second opposite surface of the target;
bringing a plate into contact with a second surface of the cooling block and the first and second magnets;
disposing the substrate in the sputtering chamber in opposed relationship to the second surface of the target to define a sputtering area within the sputtering chamber between the substrate and the second surface of the target; and
sputtering material from the second surface of the target across the sputtering area in the sputtering chamber such that the sputtering material is deposited on the substrate.

18. The method of claim 17, which further comprises:
cooling the target by supplying a coolant to an inner conduit of the cooling block in contact with the target during the sputtering operation.

19. The method of claim 17, in which:
the second magnet encircles the first magnet; and
the second pole piece encircles the first pole piece.

20. The method of claim 17, in which:
the depth of the first and second grooves in the first surface of the target nominally exceed the thickness of the first and second pole pieces.

* * * * *